United States Patent
Gao

(10) Patent No.: US 12,432,879 B2
(45) Date of Patent: Sep. 30, 2025

(54) LIQUID COOLING LEAK DETECTION APPARATUS

(71) Applicant: Lenovo Enterprise Solutions (Singapore) Pte Ltd., Singapore (SG)

(72) Inventor: Tianyi Gao, Greenboro, NC (US)

(73) Assignee: Lenovo Global Technology (United States) Inc., Morrisville, NC (US)

( * ) Notice: Subject to any disclaimer, the term of this patent is extended or adjusted under 35 U.S.C. 154(b) by 340 days.

(21) Appl. No.: 18/296,682

(22) Filed: Apr. 6, 2023

(65) Prior Publication Data

US 2024/0341060 A1 Oct. 10, 2024

(51) Int. Cl.
*H05K 7/20* (2006.01)

(52) U.S. Cl.
CPC ..... *H05K 7/20272* (2013.01); *H05K 7/20772* (2013.01)

(58) Field of Classification Search
CPC .. G06F 1/20; H05K 7/20272; H05K 7/20772; H05K 7/20781
See application file for complete search history.

(56) References Cited

U.S. PATENT DOCUMENTS

| | | | | |
|---|---|---|---|---|
| 8,102,173 B2* | 1/2012 | Merrow | ............... | G11B 33/144 324/210 |
| 10,795,096 B1* | 10/2020 | Leigh | ................... | G02B 6/3883 |
| 11,994,447 B1* | 5/2024 | Chigullapalli | ........ | G01M 3/183 |
| 2005/0247433 A1* | 11/2005 | Corrado | ................... | G06F 1/20 165/80.4 |
| 2011/0313576 A1* | 12/2011 | Nicewonger | ...... | H05K 7/20781 361/701 |
| 2012/0263491 A1* | 10/2012 | Fujiya | .................. | G03G 21/206 165/104.33 |
| 2015/0048950 A1* | 2/2015 | Zeighami | ............. | H05K 7/2079 340/618 |
| 2017/0181329 A1* | 6/2017 | Shelnutt | ............. | H05K 7/20781 |

(Continued)

FOREIGN PATENT DOCUMENTS

CN 115515366 A * 12/2022

OTHER PUBLICATIONS

Yao Xidong, "Liquid cooling device and liquid cooling system", Dec. 23, 2022, Huawei Cloud Computing Tech Co Ltd, Entire Document (Translation of CN 115515366). (Year: 2022).*

*Primary Examiner* — Stephen S Sul
(74) *Attorney, Agent, or Firm* — Jeffrey L. Streets

(57) ABSTRACT

An apparatus includes a rack mountable chassis securable directly under a plurality of liquid cooled electronics modules. A drip pan in the chassis extends beneath the plurality of liquid cooling electronics modules and has an upward-facing surface that is downwardly slanted in a lateral direction across the chassis. The upward-facing surface includes a plurality of longitudinal liquid accumulation channels that are spaced apart. The apparatus further comprises a plurality of fixed blind mating connectors and one or more liquid detection units. One of the fixed blind mating connectors is securely positioned at the distal end of each of the longitudinal liquid accumulation channels. Each liquid detection unit has a detection unit blind mating connector for forming a connection with any one of the fixed blind mating connectors to supply power to the detection unit and to enable communication of a liquid detection signal to an external controller.

20 Claims, 5 Drawing Sheets

(56) References Cited

U.S. PATENT DOCUMENTS

| | | |
|---|---|---|
| 2020/0163251 A1* | 5/2020 | Chopra .................... G06F 1/20 |
| 2023/0052992 A1* | 2/2023 | Chigullapalli ........ G01M 3/045 |
| 2023/0164952 A1* | 5/2023 | Ortega Gutierrez ........................ H05K 7/20318 361/699 |
| 2023/0171921 A1* | 6/2023 | Field .................. H05K 7/20772 700/300 |
| 2024/0196565 A1* | 6/2024 | Chen .................. H05K 7/20772 |

* cited by examiner

LIQUID COOLING LEAK DETECTION APPARATUS

BACKGROUND

The present disclosure relates to systems and methods for detecting liquid leaks in liquid cooled electronics modules.

BACKGROUND OF THE RELATED ART

Computing devices are trending toward smaller devices and form factors, allowing more computing devices to occupy a given amount of space. As a result, a greater amount of power may be consumed by the devices that occupy a given chassis, rack or datacenter. This greater power density results in the generation of an additional heat load that must be efficiently removed so that the computing devices are allowed to operate at a suitable temperature. Sets of fans have been used to force air through each chassis and across the computing devices to cool the devices, but there are limits to the efficiency of air cooling. For example, the operation of the fans consumes additional power and the chassis must be designed with suitable air passageways to cool each device. In order to meet a need to cool high performance computing devices with a high power density, liquid cooling modules are becoming more prevalent.

Despite the benefits of liquid cooling, the use of liquid cooling modules poses a risk of liquid leaks within an individual computing device and throughout a computing system. A high level of attention and care must be given to assuring that each liquid cooling module is installed properly and each connection between liquid-filled conduits is firmly and tightly connected. However, there are various reasons that a connection may develop a leak over time or that liquid will be released during a disconnection operation.

BRIEF SUMMARY

Some embodiments provide an apparatus comprising a chassis that is rack mountable and securable directly under a plurality of liquid cooled electronics modules in a rack. A drip pan is secured or formed in the chassis to extend beneath the plurality of liquid cooling electronics modules. The drip pan has an upward-facing surface that is downwardly slanted in a lateral direction across the chassis. The upward-facing surface includes a plurality of longitudinal liquid accumulation channels that are spaced apart on the upward-facing surface, wherein each longitudinal liquid accumulation channel has a proximal end and a distal end. The apparatus further comprises a plurality of fixed blind mating connectors and one or more liquid detection units. One of the fixed blind mating connectors is securely positioned at the distal end of each of the longitudinal liquid accumulation channels and is aligned with the longitudinal liquid accumulation channel. Each of the fixed blind mating connectors includes a first contact for supplying power from an electrical power source to one of the liquid detection units and a second contact for carrying a signal to a controller from the liquid detection unit. Each liquid detection unit has a distal end with a detection unit blind mating connector for forming a connection with any one of the fixed blind mating connectors, and each detection unit blind mating connector has power and signal contacts that engage the first and second contacts of a selected one the fixed blind mating connectors in response to forming a connection between the detection unit blind mating connector and the selected fixed blind mating connector.

DETAILED DESCRIPTION

Figure 1:
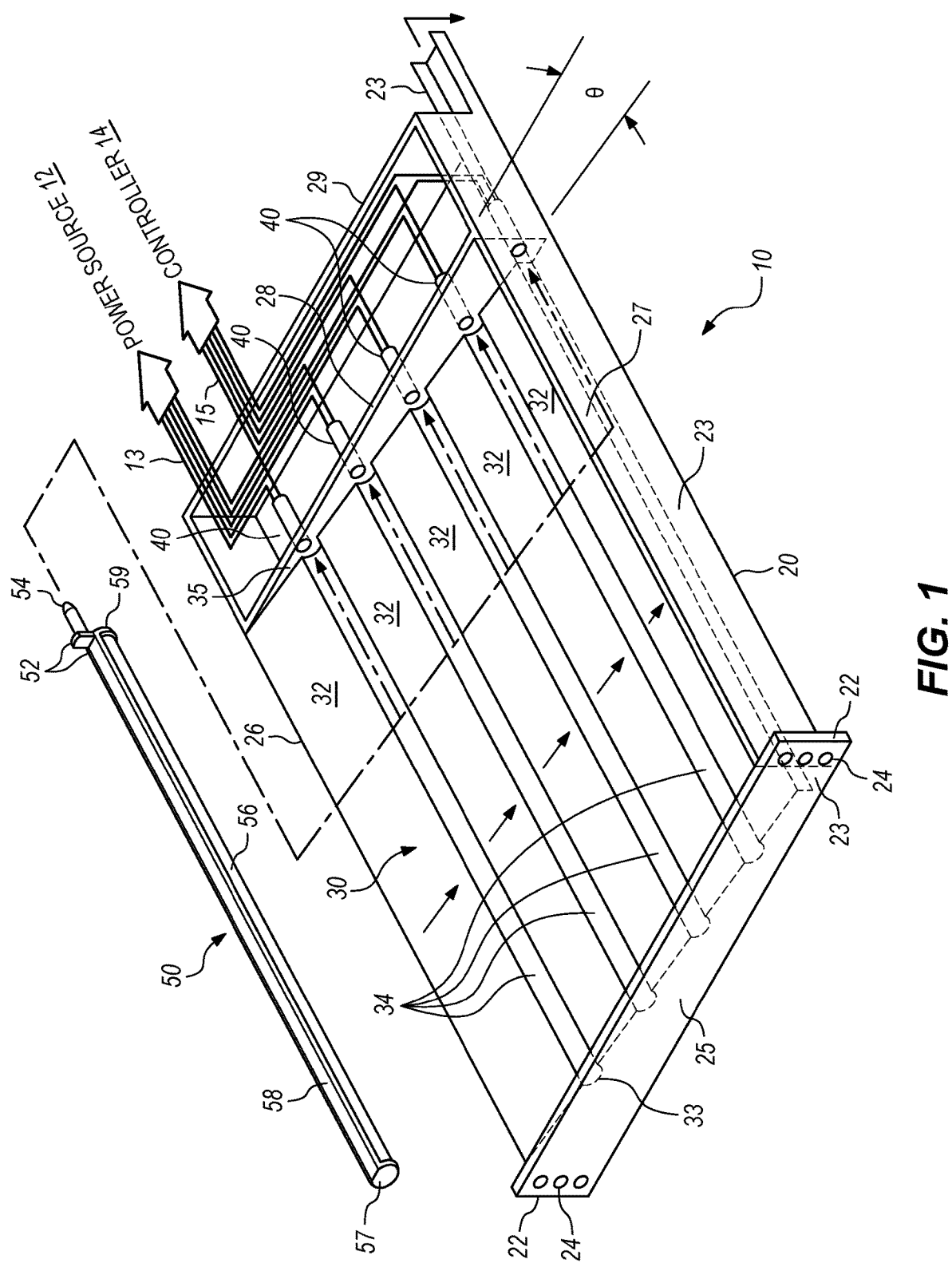
FIG. 1 is a perspective view of an apparatus for handling and detecting liquid leaking from one or more liquid cooled electronics modules.

Some embodiments provide an apparatus comprising a chassis that is rack mountable and securable directly under a plurality of liquid cooled electronics modules in a rack. A drip pan is secured or formed in the chassis and extends beneath the plurality of liquid cooling electronics modules. The drip pan has an upward-facing surface that is downwardly slanted in a lateral direction across the chassis. The upward-facing surface includes a plurality of longitudinal liquid accumulation channels that are spaced apart on the upward-facing surface, wherein each longitudinal liquid accumulation channel has a proximal end and a distal end. The apparatus further comprises a plurality of fixed blind mating connectors and one or more liquid detection units. One of the fixed blind mating connectors is securely positioned at the distal end of each of the longitudinal liquid accumulation channels and is aligned with the longitudinal liquid accumulation channel. Each of the fixed blind mating connectors includes a first contact for supplying power from an electrical power source to one of the liquid detection units and a second contact for carrying a signal to a controller from the liquid detection unit. Each liquid detection unit has a distal end with a detection unit blind mating connector for forming a connection with any one of the fixed blind mating connectors, and each detection unit blind mating connector has power and signal contacts that engage the first and second contacts of a selected one the fixed blind mating connectors in response to forming a connection between the detection unit blind mating connector and the selected fixed blind mating connector.

The chassis is a mechanical structure that supports the other components of the apparatus. In one option, the chassis may be made rack-mountable by making the chassis to a suitable width and depth to fit within a rack and include front side flanges with mounting holes that align with mounting holes of the rack. Optionally, the chassis may have one or more standard dimensions, such as a height that occupies one rack unit ("1 U") or some other number of rack units.

The drip pan may be formed along with one or more component of the chassis, perhaps by bending or shaping a piece of sheet metal or may be a separate component that is secured within the chassis. The drip pan may be made with metal, plastic or other nonporous material. The upward-facing surface of the drip pan is downwardly slanted in a lateral direction and includes the plurality of longitudinal liquid accumulation channels. The drip pan is preferably a single piece with no seems or connections that might allow liquid to pass therethrough. The angle or degree of inclination of the slant of the upward-facing surface is not critical but should be sufficient to direct liquid falling on the upward-facing surface into the next lower channel from the point on the drip pan where the liquid initially hits the drip pan. Furthermore, the angle or degree of inclination of the slant of the upward-facing surface is preferably small so that the apparatus does not occupy more rack space than is truly necessary. For example, a preferred drip pan may have a downward slant defined by an angle between 1 and 20 degrees relative to horizontal, and more preferably between 2 and 10 degrees relative to horizontal, and most preferably between 2 and 5 degrees relative to horizontal. While the drip pan may be downwardly slanted in a single direction to direct liquid to one side of the chassis, the drip pan may also be downwardly slanted in an alternative manner such as being downwardly slanting to a central area (forming a "V" shaped drip pan) having the liquid removal channel.

The longitudinal liquid accumulation channels may have various shapes, depths and layouts within the drip pan. In one non-limiting example, each channel may have a semicircular profile suitable to receive at least a lower portion of a detection unit having a generally circular profile. Furthermore, each longitudinal liquid accumulation channel should have some area that is lower than either side of the channel so that liquid is accumulated within the channel. It is possible that one drip or even a few drips may not trigger the detection unit, but the longitudinal liquid accumulation channels are configured to accumulate the drips over time so that the liquid from even a slow or periodic leak may accumulate in the channel until the detection unit senses the presence of the liquid and generates a liquid detection signal. However, the longitudinal liquid accumulation channel is not intended to accumulate large amounts of liquid but is preferably sized and shaped to accumulate only enough liquid to support reliable detection of the liquid. In one option, the plurality of longitudinal liquid accumulation channels may be linear channels that are parallel to each other. In other option, the drip pan may include between 3 and 12 longitudinal liquid accumulation channels, but preferably between about 3 and 8 depending upon the rack width and the size and number of the liquid cooled electronics modules that are installed across the width of the rack.

The one or more liquid detection units may use various liquid detection technologies and configurations. However, a liquid detection unit should be positionable within a longitudinal liquid accumulation channel and should be able to sense small amounts of liquid after it has accumulated in a lower portion of the longitudinal liquid accumulation channel in which it is positioned. In one embodiment, each detection unit may include a liquid detection cable and a rigid bar. The rigid bar may have a distal end securing the detection unit blind mating connector and the liquid detection cable may have a distal end coupled to the detection unit blind mating connector. A proximal end of the liquid detection cable is preferably coupled to a proximal end of the rigid bar. In one option, the liquid detection cable may include a plurality of sensors spaced apart along a length of the liquid detection cable, such that the liquid detection cable generates a liquid detection signal in response to liquid spanning a gap between an adjacent pair of the sensors.

The spacing between the longitudinal liquid accumulation channels may be configured to support various degrees of granularity between liquid detection units. For example, each liquid cooled electronics module that may be installed directly above the present apparatus may define a drip area of the drip pan directly beneath the liquid cooled electronics module. Accordingly, in order to support leak detection that is specific to the individual liquid cooled electronics module, one of the liquid detection units is preferably installed in a selected one of the longitudinal liquid accumulation channels that is near a lower edge of the drip area. In such a configuration, a leak detection signal generated by the liquid detection unit installed in the selected channel may be associated with a liquid leak from the individual liquid cooled electronics module. It should be appreciated that the spacing of the longitudinal liquid accumulation channels and the fixed blind mate connectors may be determined by the width of the liquid cooled electronics modules that are to be installed and operated above the present apparatus. For example, if the apparatus is to be rack-mounted below six (6) narrow liquid cooled electronic modules, such as a liquid cooled server, then the drip pan may be configured with six (6) longitudinal liquid accumulation channels. Conversely, if the apparatus is to be rack-mounted below three (3) wider liquid cooled electronic modules, then the drip pan could be configured with three (3) longitudinal liquid accumulation channels. However, there is a technical benefit of the present apparatus that the apparatus having a drip pan with six (6) longitudinal liquid accumulation channels may be effectively and efficiently used to detect leaks from either the six (6) narrow liquid cooled electronic modules, or the three (3) wider liquid cooled electronic modules. Specifically, a detection unit may be installed in all six (6) longitudinal liquid accumulation channels (i.e., a total of six detection units) for the scenario where the apparatus is rack-mounted below six (6) narrow liquid cooled electronic modules, whereas a detection unit may be installed in the second channel, the fourth channel and the liquid removal channel (i.e., a total of three detection units) for the scenario where the apparatus is rack-mounted below three (3) wider liquid cooled electronic modules. In the latter scenario, the drip area for each wider liquid cooled electronics module will span over one of the longitudinal liquid accumulation channels.

In some embodiments, each liquid cooled electronics module that is installed above the chassis will define a drip area of the pan directly beneath the liquid cooled electronics module. One of the liquid detection units may be installed in the longitudinal liquid accumulation channel near the lower edge of the drip area or the longitudinal liquid accumulation channel that is nearest to the drip area that is also lower than the drip area. Liquid leaking from the liquid cooled electronics module will drop into the drip area, flow down the downwardly slanted surface and accumulate in the longitudinal liquid accumulation channel near the lower edge of the drip area. In scenarios where the drip area for a wide liquid cooled electronics module spans across a first longitudinal liquid accumulation channel that does not include a detection unit, liquid leaking from the liquid cooled electronic module may drop into the drip area above (i.e., up the slanted surface from) the first longitudinal liquid accumulation channel, flow down the downwardly slanted surface and accumulate in the first longitudinal liquid accumulation channel. However, without a detection unit installed in the first longitudinal liquid accumulation channel, no detection signal is generated at that point. So, the liquid may continue to accumulate until the first longitudinal liquid accumulation channel spills over and the liquid flows down the downwardly slanted surface to the next longitudinal liquid accumulation channel where the detection unit is located. The detection unit will then detect the liquid and generate a detection signal representing a liquid leak associated with the wide liquid cooled electronics module that is installed directly above the respective drip area.

In some embodiments, each of the plurality of electronics modules may be formed on a printed circuit board that is installed in the rack with an upright orientation. The upright orientation of the printed circuit board may prevent liquid pooling and/or channeling on the printed circuit board and facilitates a direct relationship or association between the electronic module and the drip area of the upwardly facing surface. In one option, the longitudinal liquid accumulation channels may be positioned directly beneath boundaries between adjacent pairs of the plurality of electronics modules.

Some embodiments may further comprise a liquid removal channel disposed at a low point in the drip pan, such as a lateral edge of the chassis or in the middle of the chassis. A liquid leak that is caught anywhere on the drip pan will initially accumulate in the longitudinal liquid accumulation channel that is immediately downhill (i.e., in the direction of the downward slant) of where liquid drips onto the drip pan. Once that longitudinal liquid accumulation channel has filled up, any additional liquid will cause the liquid to overrun that channel and spill over to the next channel in the direction of the downward slant until the liquid reaches the liquid removal channel. The liquid removal channel preferably extends distally into communication with a rack conduit, wherein liquid that accumulates in the liquid removal channel is directly to flow into the rack conduit. Such a rack conduit may be in fluid communication with the liquid removal channels of multiple instances of the apparatus described herein that may be installed in the same rack. In one option, a detection unit may be disposed in the liquid removal channel and coupled with a blind mate connector at the distal end of the liquid removal channel. As a result, the liquid removal channel may serve the dual purposes of supporting the detection of liquid by the detection unit therein and directing liquid out of the rack via the rack conduit. If the detection unit in the liquid removal channel detects liquid and other detection units in the same apparatus have not detecting liquid, then this could be an indication that liquid is leaking form the liquid cooled electronics module that is closest to the liquid removal channel (i.e., above the closets/lowest drip area of the drip pan).

In some embodiments, the liquid detection signal from each liquid detection unit may be associated with a specific location in the rack and/or a given one of the electronics modules. In one example, the fixed blind mate connector aligned with each longitudinal liquid accumulation channel may have a dedicated signal line to the back of the apparatus, wherein the dedicated signal line may be connected for communication to a system management computer running system management software. With knowledge of the location of the liquid cooled electronics modules within the rack and the location each instance of the present apparatus, a system administrator may use the system management software to associate the dedicated signal line to a certain rack location and/or certain liquid cooled electronic module, such as a certain server. Accordingly, detection of liquid by a particular detection unit may trigger an alert that a liquid leak is suspected in the certain rack location and/or the certain liquid cooled electronic module. Furthermore, it is then possible to take responsive action on the certain liquid cooled electronics module, if desired, to minimize operations on the electronics module in anticipation of the electronics module being shut down for service.

In some embodiments, the detection unit blind mating connector of a selected one of the detection units may be alignable for connection with a selected one of the fixed blind mating connectors by sliding the distal end of the selected detection unit along or through the longitudinal liquid accumulation channel that is aligned with the selected fixed bling mating connector. Accordingly, a system administrator or other user may hold the proximal end of a detection unit, insert the distal end of the detection unit into a selected longitudinal liquid accumulation channel, and push the detection unit into the chassis until the distal blind mate connector forms a connection with the fixed blink mate connector that is located at the distal end of the selected longitudinal liquid accumulation channel. In a further option, the liquid detection units may be field-replaceable from the proximal end of the longitudinal liquid accumulation channels.

In some embodiments, the drip pan has a rim that extends along a substantial portion or the entirety of the front and back edges of the pan. Such a rim may help to contain liquid that comes into contact with the drip pan.

Figure 4:
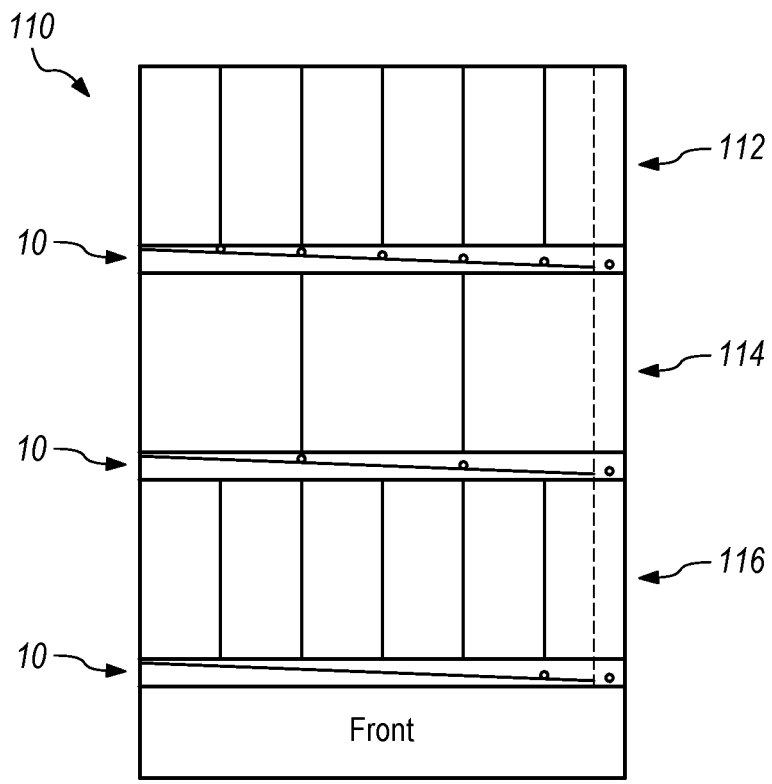
FIG. 4 is a diagram of a rack that supports various sizes and configurations of liquid cooled electronics modules arranged in rows and has an instance of the apparatus mounted under each row.

FIG. 1 is a perspective view of an apparatus 10 for handling and detecting liquid leaking from one or more liquid cooled electronics modules (not shown; see FIG. 4). The apparatus includes a chassis 20 that is rack mountable and securable directly under a plurality of liquid cooled electronics modules in a rack. For example, the chassis 20 is shown having a pair of side rails 22 with mounting holes 24 suitable for securing the chassis into a rack. The chassis 20 may include a front panel 25, a first lateral side 26 (left side as shown in FIG. 1), a second lateral side 27 (right side as shown in FIG. 1), and a back panel 28. However, the chassis may also include a further back compartment 29 that provides protection for various wires and connectors and a liquid removal channel 23 that extends rearward from the chassis 20.

A drip pan 30 is secured or formed in the chassis 20 and extends beneath the plurality of liquid cooling electronics modules. The drip pan 30 has an upward-facing surface 32 that is downwardly slanted from the first lateral side or edge 26 of the chassis 20 to the second lateral side or edge 27 of the chassis. The upward-facing surface 32 includes four longitudinal liquid accumulation channels 34 that are inset into the surface 32 and spaced apart on the upward-facing surface 32. Each longitudinal liquid accumulation channel 34 has a proximal end 33 (near the front panel 25) and a distal end 35 (near the back panel 28). The longitudinal liquid accumulation channels 34 are shown to each have a cross-sectional profile that is curved, such as an arc of a circle or a fully semicircle.

A plurality of fixed blind mating connectors 40 are secured to the back panel 28 in positions at the distal end of each of the longitudinal liquid accumulation channels 34. Each of the fixed blind mating connectors 40 is aligned with a respective one of the longitudinal liquid accumulation channels 34 for forming a connection with a detection unit 50 (only one shown). The fixed blind mating connectors 40 each include a first contact for supplying power from an electrical power source 12 through conductive wires 13 to each of the installed liquid detection units 50 and a second contact for carrying a signal from each installed liquid detection unit 50 through conductive wires 15 to a controller 14.

Each liquid detection unit 50 (only one shown) has a distal end 52 with a detection unit blind mating connector 54 for forming a connection with any one of the fixed blind mating connectors 40 secured to the back panel 28. Each detection unit blind mating connector 54 has power and signal contacts that engage the first and second contacts of a selected one the fixed blind mating connectors 40 in response to forming a connection between the detection unit blind mating connector 54 and the selected fixed blind mating connector 40.

The liquid detection unit 50 includes liquid detection cable 56 and a rigid rib or frame 58 that extends the length of the longitudinal liquid accumulation channels 34. The rigid rib 58 may support a proximal end cap 57 that secures a proximal end of the liquid detection cable 56 and a distal end cap 59 that secures the distal end of the liquid detection cable 56 as well as the detection unit blind mating connector 54. Power and signal lines extend through the liquid detection cable to and from a series of sensors and terminate in the detection unit blind mating connector 54. In one option, the fixed blind mating connector 40 is raised above the longitudinal liquid accumulate channel 34 so that it is never submersed in liquid and the distal blind mating connector 54 is elevated above the leak detection cable 56 so that it will align with the fixed blind mating connector 40. Still, electrically insulated wires from the leak detection cable 56 may extend along the distal end cap 59 from the cable 56 to the detection unit blind mating connector 54. When the distal blind mating connector 54 of the liquid detection unit 50 forms a connection with one of the fixed blind mating connectors 40, the power lines are connected to the external power source 12, such as a rack power source, and the signal lines are connected to the controller 14. The controller 14 may be a dedicated leak detection controller or a system management controller.

In further reference to FIG. 1, the slanted surface 32 assists in causing leaked fluid that drips or flows onto the surface 32 to be quickly directed toward the second lateral side 27 and into the liquid removal channel 23. The liquid removal channel 23 then directs the liquid to the back of the rack to a rack conduit (not shown; see FIG. 6) so that the water can be removed from the rack before causing any major damage or impacting other electronic modules. In addition, the structure provides for quick and accurate detection of liquid leakage and identification of the location where the leakage originated.

Figure 2:
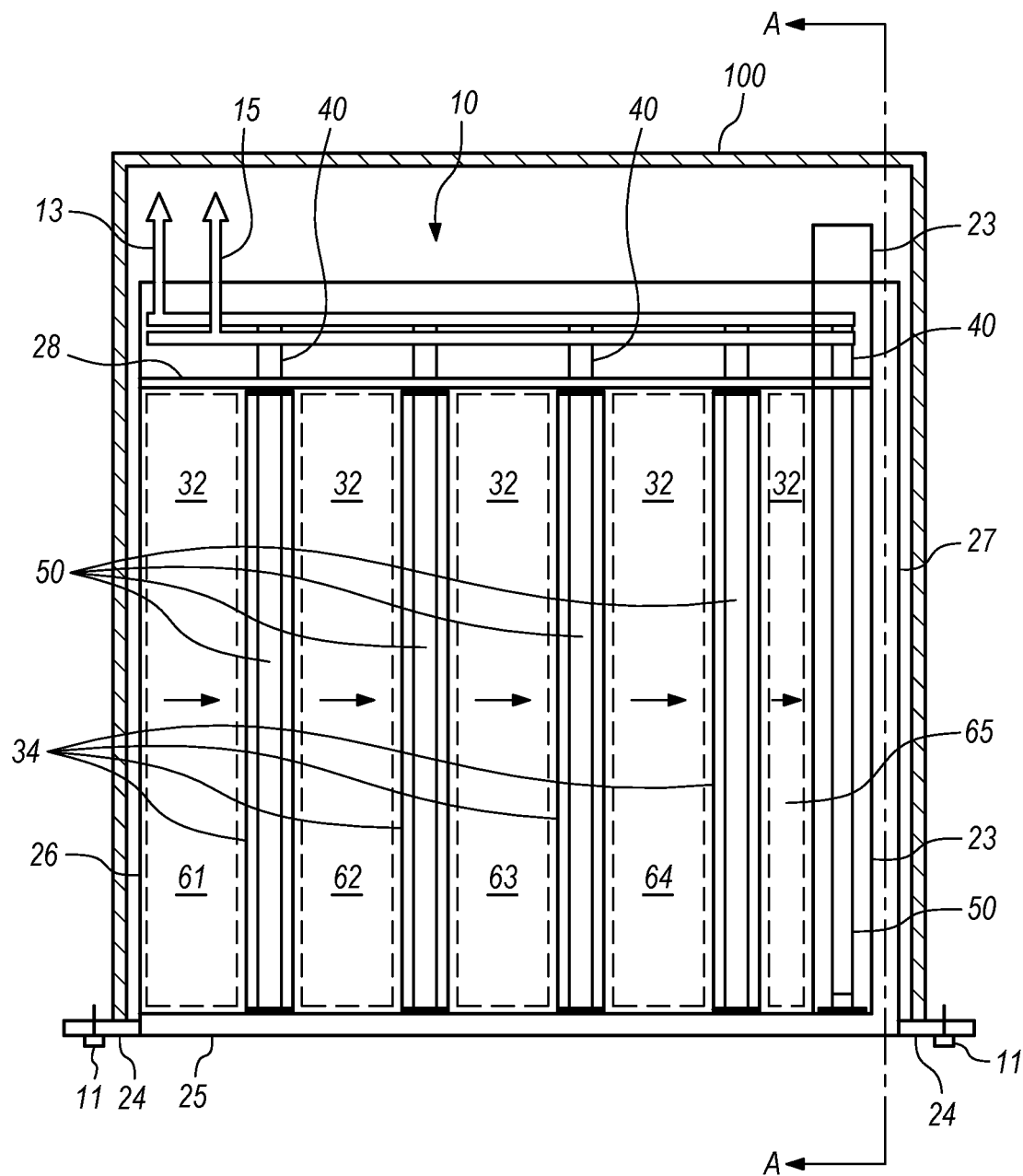
FIG. 2 is a schematic plan view of the apparatus mounted in a rack with a plurality of liquid detection units installed in the liquid accumulation channels.

FIG. 2 is a schematic plan view of the apparatus 10 mounted in a rack 100. Specifically, the apparatus 10 is secured into the rack using screws 11 that are extended through the mounting holes 24 in the flange 24 along the front panel 25 of the apparatus and threaded into threaded holes in the rack 10.

There are four liquid detection units 50 installed in the four liquid accumulation channels 34 and another liquid detection unit 50 installed in the liquid removal channel 23. Each liquid detection unit 50 has formed a connection with one of the fixed blind mating connectors 40 secured to the back panel 28. Furthermore, each of the fixed blind mating connectors 40 has power and signal conductors, such as wires, for connecting to a power source and a controller, respectively.

In the illustrated configuration, the apparatus 10 establishes five separate and distinguishable drip areas 61, 62, 63, 64, 65 (dashed outlines) on the upwardly facing surface 32. Liquid leaking from a liquid cooling module that drops into one of these drip areas will flow downhill along the slant of the upwardly facing surface 32 into the nearest downhill liquid accumulation channel 34. Consistent with FIG. 1, the surface 32 slants downward to the right. Accordingly, the liquid detection unit 50 to the right of each drip area is associated with the drip area and will detection liquid accumulating in the channel 50. In some embodiments, each drip area 61, 62, 63, 64, 65 may correspond to a liquid cooled electronics module, such as a server, that is positioned directly above the drip area. For example, the illustrated configuration of the apparatus 10 is well suited to detect leaks from five liquid cooled electronics modules installed directly above each of the five drip areas.

Figure 3:
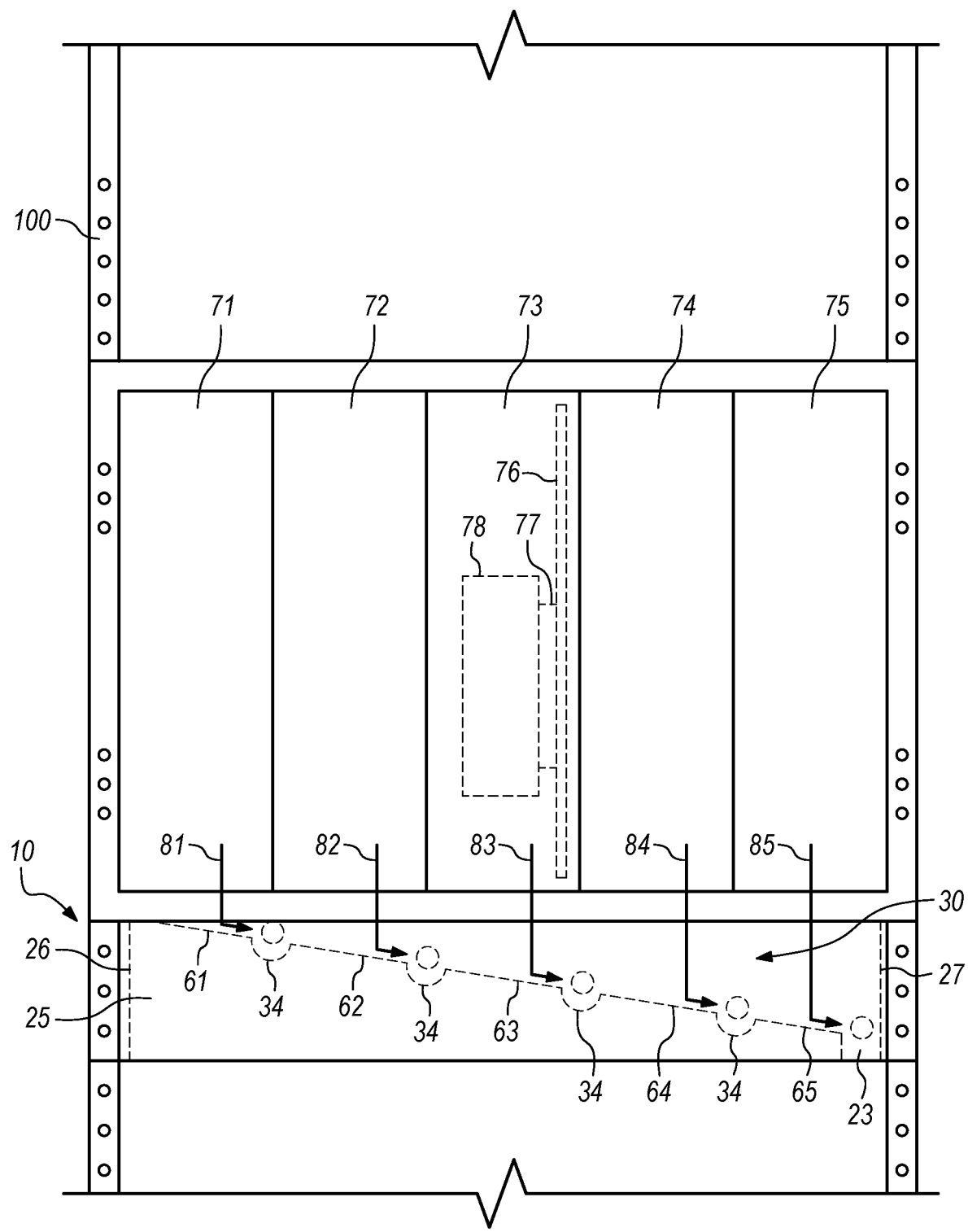
FIG. 3 is a front view of the apparatus mounted in a rack immediately below a group of liquid cooled electronics modules, such as computer servers.

FIG. 3 is a front view of the apparatus 10 mounted in the rack 100 immediately below a group of liquid cooled electronics modules 71, 72, 73, 74, 75, such as computer servers. As one example representative of any or all of the liquid cooled electronics modules, the liquid cooled electronics module 73 is shown in an upright orientation and having a printed circuit board 76 with an electronic component 77, such as a central processing unit. A liquid cooling module 78 is positioned in thermal contact with the component 77 to remove heat from the component and keep the component temperature within a desired temperature range. However, if the liquid cooling module 78 or liquid filled conduit connections (not shown) to or from the liquid cooling module were to have a leak, the liquid would fall onto the drip pan 30 that is positioned directly there below. Specifically, liquid leaking from the liquid cooled electronics module 71 would fall into the drip area 61 and flow downhill to the nearest liquid accumulation channel 34 (see arrow 81), liquid leaking from the liquid cooled electronics module 72 would fall into the drip area 62 and flow downhill to the nearest liquid accumulation channel 34 (see arrow 82), liquid leaking from the liquid cooled electronics module 73 would fall into the drip area 63 and flow downhill to the nearest liquid accumulation channel 34 (see arrow 83), liquid leaking from the liquid cooled electronics module 74 would fall into the drip area 64 and flow downhill to the nearest liquid accumulation channel 34 (see arrow 84), and liquid leaking from the liquid cooled electronics module 75 would fall into the drip area 65 and flow downhill to the nearest liquid accumulation channel 34 (see arrow 85). A liquid detection unit 50 (not shown; see FIGS. 1 and 2) located in the particular channel 34 or liquid removal channel 23 where liquid accumulates will detect the liquid and generate a liquid detection signal that indicates the location and/or the specific one of the liquid cooled electronics modules 71, 72, 73, 74, 75 that has a leak.

It is acknowledged that any substantial leak will, after being detected by a detection unit installed in the nearest downhill liquid accumulation channel 34, overflow the nearest liquid accumulation channel 34 and continue to flow down the slanted surface 32 (shown in FIG. 3 as comprising the drip areas 61, 62, 63, 64, 65) until the liquid reaches the liquid removal channel 23 and flows out of the apparatus 10. As a result of this flow path, it can be expected that a significant liquid leak in one drip area will be initially detected by a liquid detection unit in the nearest downhill liquid accumulation channel but may eventually be detected by each of the liquid detection units installed in liquid accumulation channels 34 that are even lower along the slanted surface. Although this may result in the controller 14 (see FIG. 1) receiving multiple liquid detection signals from multiple liquid detection units, the controller logic may attribute the liquid leak to the first (highest) of the liquid detection units to generate a liquid detection signal. For example, a liquid leak as indicated by the arrow 81 might trigger signals from five liquid detection units, wherein a liquid leak as indicated by the arrow 84 might trigger signals from two liquid detection units. The longitudinal liquid accumulation channels 34 are preferably no deeper than necessary to achieve reliable liquid detection.

FIG. 4 is a schematic diagram of a hypothetical rack 110 that supports various sizes and configurations of liquid cooled electronics modules arranged in rows 112, 114, 116. Each of the three illustrated rows has an instance of the apparatus 10 mounted directly under the liquid cooled electronics modules. For example, the top row 112 has six liquid cooled electronics modules with a first apparatus 10 secured directly there below. In order to independently detect a leak from any one of the six liquid cooled electronics modules in row 112, the first apparatus 10 below row 112 has been configured with a total of six detection units (illustrated as circles). The middle row 114 has three liquid cooled electronics modules with a second apparatus 10 secured directly there below. In order to independently detect a leak from any one of the three liquid cooled electronics modules in row 114, the second apparatus 10 below row 114 has been configured with a total of only three detection units (illustrated as circles). Note that the second apparatus 10 directly below row 114 may have the same six liquid accumulation channels, but only the second liquid accumulation channel, fourth liquid accumulation channel and liquid removal channel have been populated with a detection unit. The bottom row 116 has six liquid cooled electronics modules with a third apparatus 10 secured directly there below. However, the third apparatus 10 is only populated with two detection units in the lowest liquid accumulation channel and the liquid removal channel. This configuration of the apparatus will not identify which of the six liquid cooled electronics modules is leaking liquid but will identify when there is liquid leaking from one or more of the liquid cooled electronics modules in the bottom row 116. An alert triggered by output from the detection units of the third apparatus may be sufficient to notify a system administrator to investigate the source of the leak in the bottom row 116. It should be appreciated that detection units may be inserted into any of the liquid accumulation channels and connected to a fixed blind mating connector based on the configuration of electronics module above the apparatus to implement a desired detection locality and accuracy within the rack. Furthermore, the fact that there is may be multiple detection units triggered by a single leak provides a degree of detection redundancy and reliability.

Figure 5:
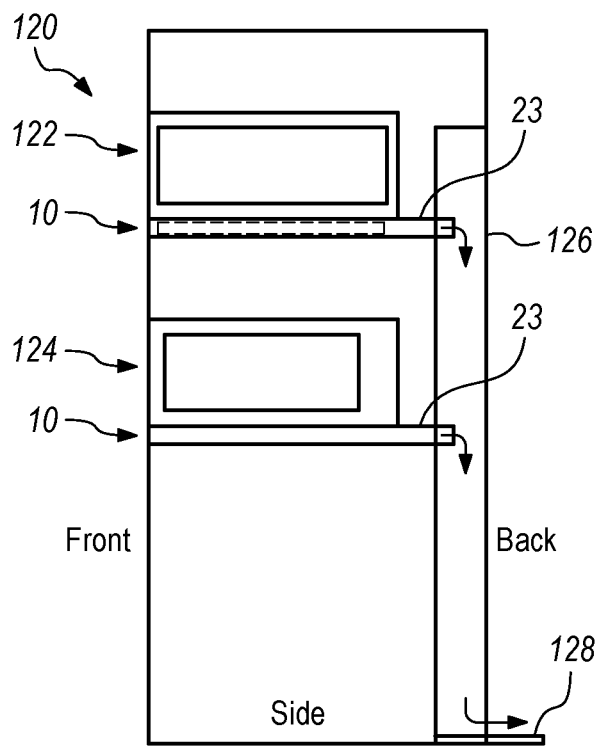
FIG. 5 is a side view of a rack illustrating the interface between the apparatus and a rack-level conduit for discharging liquid from the rack.

FIG. 5 is a side view of a rack 120 illustrating a first row of liquid cooled electronic modules 122 with a first instance of the apparatus 10 mounted directly below the first row. Similarly, a second row of liquid cooled electronic modules 124 is secured in the rack with a second instance of the apparatus 10 mounted directly below the first row. Each instance of the apparatus 10 has a liquid removal channel 23 that extends along the side of the apparatus 10 from the front panel to the back panel and extends further to interface with a rack-level conduit 126 for discharging liquid from the rack. The rack-level conduit 126 may be substantially vertical and independently secured to the rack 120. As shown, liquid may be discharged from the distal end of the liquid removal channel 23 of each apparatus 10 into the rack-level conduit 126 as shown by the downturned arrows. Liquid then drops or flows down the rack-level conduit 126 and is discharged from the rack through an external port 128 as shown by the lower arrow.

Figure 6A:
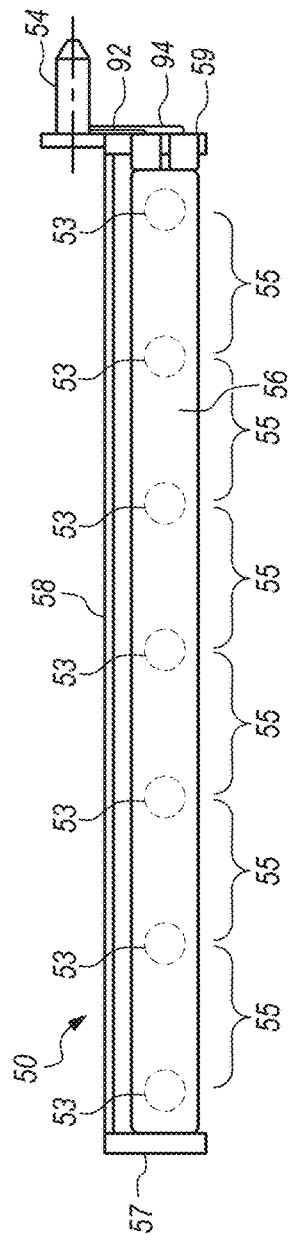
FIG. 6A-C are side views of an individual liquid detection unit alone, during installation, and in a fully installed and operative position with a liquid accumulation channel and having formed a connection with a fixed blind mating connector.

FIG. 6A is a side view of an individual liquid detection unit 50. The liquid detection unit 50 includes liquid detection cable 56 and a rigid rib or frame 58 that extends the length of the longitudinal liquid accumulation channels 34. The liquid detection cable generates a liquid detection signal in response to liquid spanning a gap 55 between an adjacent pair of the sensors 53. The rigid rib 58 may support a proximal end cap 57 that secures a proximal end of the liquid detection cable 56 and a distal end cap 59 that secures the distal end of the liquid detection cable 56 as well as the detection unit blind mating connector 54. Power and signal lines extend through the liquid detection cable to and from a series of sensors (not shown) and terminate in the detection unit blind mating connector 54. The detection unit blind mating connector 54 is optionally elevated above the liquid detection cable 56 such that the detection unit blind mating connector 54 (as well as any of the fixed blind mating connectors 40) does not need to ever be submersed in liquid that accumulates within the liquid accumulation channel 34.

Figure 6B:
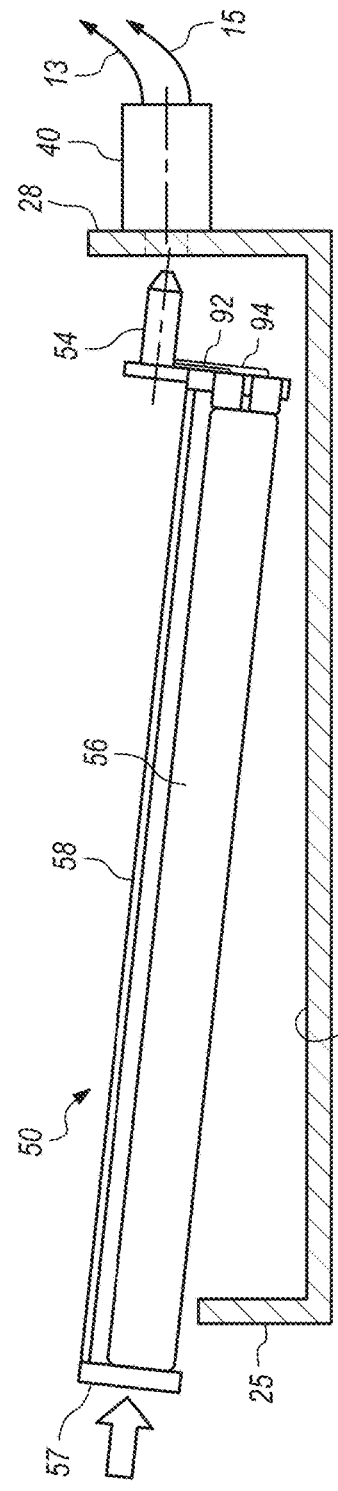

FIG. 6B is a side view of the individual liquid detection unit 50 of FIG. 6A in a position with its distal end in the longitudinal liquid accumulate channel 34 so that the detection unit (distal) blind mating connector 54 is aligned with the fixed blind mating connector 40. Self-alignment features on the blind mating connectors 54, 40, such as beveled edges or chamfers, may cooperate to assist with alignment or self-guidance in forming the connection. Optionally, both of the blind mating connectors 54, 40 are raised above the longitudinal liquid accumulate channel 34 so that neither is ever submersed in liquid, yet the detection unit blind mating connector 54 will align with the fixed blind mating connector 40 when the distal end of the of the rigid rib or frame 58 slides along the bottom of the liquid accumulation channel 34. Still, electrically insulated wires, such as electrical power wires 92 and signal wires 94, from the leak detection cable 56 may extend along the distal end cap 59 from the cable 56 to the detection unit blind mating connector 54.

Figure 6C:
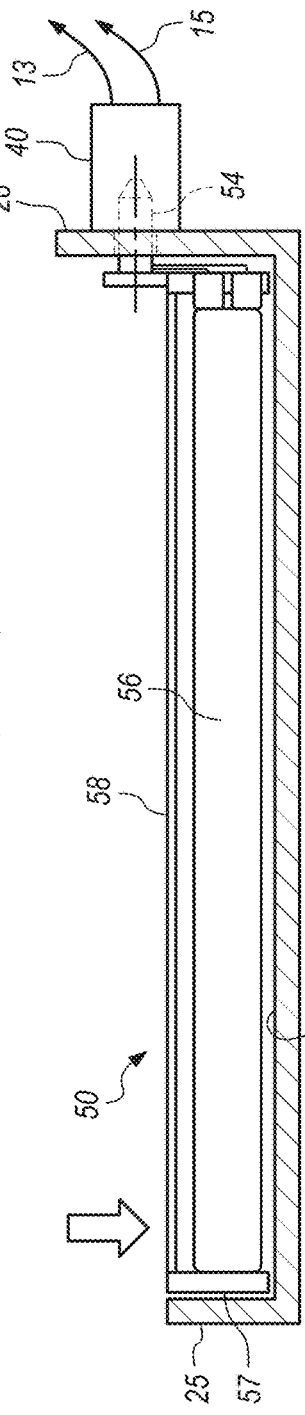

FIG. 6C is a side view of the individual liquid detection unit 50 of FIG. 6B after the distal end has been being pushed to the right so that the distal blind mating connector 54 of the liquid detection unit 50 forms a connection with the fixed blind mating connectors 40 and the proximal end of the liquid detection unit 50 has been lowered down into the liquid accumulation channel 34. This may be considered to be an operative position for the individual liquid detection unit 50. In this position, the power lines are connected to the external power source via line 13, such as a rack power source, and the signal lines are connected to the external controller via line 15.

A liquid detection unit 50 is an electronic device that is designed to detect the presence of a liquid, such as water or an aqueous liquid. The liquid detection unit may provide a liquid detection signal or alert in time to allow the prevention of water damage. A suitable liquid detection unit may be a small cable or device that lies flat against a surface, such as the liquid accumulation channel, and relies on the electrical conductivity of the liquid to decrease the resistance across two contacts within the unit in the presence of enough water to bridge the contacts.

The terminology used herein is for the purpose of describing particular embodiments only and is not intended to limit the scope of the claims. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the embodiment.

The corresponding structures, materials, acts, and equivalents of all means or steps plus function elements in the claims below are intended to include any structure, material, or act for performing the function in combination with other claimed elements as specifically claimed. Embodiments have been presented for purposes of illustration and description, but it is not intended to be exhaustive or limited to the embodiments in the form disclosed. Many modifications and variations will be apparent to those of ordinary skill in the art after reading this disclosure. The disclosed embodiments were chosen and described as non-limiting examples to enable others of ordinary skill in the art to understand these embodiments and other embodiments involving modifications suited to a particular implementation.

What is claimed is:

1. An apparatus, comprising:
   a chassis that is rack mountable and securable directly under a plurality of liquid cooled electronics modules in a rack;
   a drip pan secured in the chassis to extend beneath the plurality of liquid cooling electronics modules, wherein the drip pan has an upward-facing surface that has a downwardly slanted surface in a lateral direction across the chassis, wherein the upward-facing surface includes a plurality of longitudinal liquid accumulation channels that are spaced apart on the upward-facing surface, and wherein each longitudinal liquid accumulation channel has a proximal end and a distal end;
   a plurality of fixed blind mating connectors, wherein, for each of the longitudinal liquid accumulation channels, one of the fixed blind mating connectors is securely positioned at the distal end of the longitudinal liquid accumulation channels and aligned with the longitudinal liquid accumulation channel, and wherein each of the fixed blind mating connectors includes a first contact for supplying power from an electrical power source and a second contact for carrying a signal to a controller; and
   one or more liquid detection units, wherein each liquid detection unit has a distal end having a detection unit blind mating connector for forming a connection with any one of the plurality of fixed blind mating connectors, and wherein each detection unit blind mating connector has power and signal contacts that engage the first and second contacts of a selected one the plurality of fixed blind mating connectors in response to forming a connection between the detection unit blind mating connector and the selected fixed blind mating connector.

2. The apparatus of claim 1, further comprising:
   a liquid removal channel disposed at a low point of the downwardly slanted surface, wherein the liquid removal channel extends distally into communication with a rack conduit, wherein any liquid that accumulates in the liquid removal channel directly flows into the rack conduit.

3. The apparatus of claim 1, wherein the detection unit blind mating connector of a selected one of the one or more liquid detection units is alignable for connection with the selected fixed blind mating connector by sliding the distal end of the selected detection unit through a longitudinal liquid accumulation channel of the plurality of longitudinal liquid accumulation channels that is aligned with the selected fixed blind mating connector.

4. The apparatus of claim 1, wherein each liquid detection unit of the one or more liquid detection units includes a liquid detection cable and a rigid bar, wherein the rigid bar has a distal end securing the detection unit blind mating connector, and wherein the liquid detection cable has a distal end coupled to the detection unit blind mating connector and a proximal end coupled to a proximal end of the rigid bar.

5. The apparatus of claim 4, wherein the liquid detection cable includes a plurality of sensors spaced apart along a length of the liquid detection cable, wherein the liquid detection cable generates a liquid detection signal in response to liquid spanning a gap between an adjacent pair of the sensors.

6. The apparatus of claim 1, wherein, for each liquid cooled electronics module installed above the chassis, a liquid cooled electronics module of the plurality of liquid cooled electronics modules defines a drip area of the drip pan directly beneath the liquid cooled electronics module and one of the liquid detection units is installed in a longitudinal liquid accumulation channel of the plurality of longitudinal liquid accumulation channels near a lower edge of the drip area.

7. The apparatus of claim 6, wherein liquid leaking from the liquid cooled electronics module will drop into the drip area, flow down the downwardly slanted surface and accumulate in the longitudinal liquid accumulation channel near the lower edge of the drip area.

8. The apparatus of claim 1, wherein, for each liquid cooled electronics module installed above the chassis, a liquid cooled electronics module defines a drip area of the drip pan directly beneath the liquid cooled electronics module and one of the liquid detection units is installed in a longitudinal liquid accumulation channel of the plurality of longitudinal liquid accumulation channels that is nearest to the drip area and lower than the drip area.

9. The apparatus of claim 1, wherein each of the plurality of liquid cooled electronics modules is formed on a printed circuit board that is installed in the rack with an upright orientation.

10. The apparatus of claim 9, wherein the plurality of longitudinal liquid accumulation channels are positioned directly beneath boundaries between adjacent pairs of the plurality of liquid cooled electronics modules.

11. The apparatus of claim 10, further comprising:
    a liquid removal channel located along a lowest edge of the drip pan, wherein the liquid removal channel extends distally into communication with a rack conduit, wherein liquid that accumulates in the liquid removal channel directly flows into the rack conduit; and
    a dedicated detection unit disposed in the liquid removal channel.

12. The apparatus of claim 1, wherein a liquid detection signal from each liquid detection unit is associated with a specific location in the rack and/or a given one of the plurality of liquid cooled electronics modules.

13. The apparatus of claim 1, wherein the chassis occupies one rack unit of space in the rack.

14. The apparatus of claim 1, wherein the drip pan has a downward slant defined by an angle between 2 and 5 degrees relative to horizontal.

15. The apparatus of claim 1, wherein the drip pan has rims along front and back edges of the pan.

16. The apparatus of claim 1, wherein the plurality of longitudinal liquid accumulation channels are linear channels that are parallel to each other.

17. The apparatus of claim 1, the plurality of longitudinal liquid accumulation channels includes between 3 and 12 longitudinal liquid accumulation channels.

18. The apparatus of claim 1, wherein the one or more liquid detection units are field-replaceable from the proximal end of the plurality of longitudinal liquid accumulation channels.

19. The apparatus of claim 1, wherein the plurality of fixed blind mating connectors are elevated above the plurality of longitudinal liquid accumulation channels and the upward facing surface of the drip pan.

20. The apparatus of claim 19, wherein the detection unit blind mating connector of the one or more liquid detection units aligns with any one of the plurality of fixed blind mating connectors when the distal end of the one or more liquid detection units slides along a bottom of the plurality of liquid accumulation channels.

\* \* \* \* \*